(12) United States Patent
Pagnanelli

(10) Patent No.: US 12,367,910 B2
(45) Date of Patent: Jul. 22, 2025

(54) DIFFERENTIAL LINE DRIVER

(71) Applicant: Pagnanelli Family Trust, Huntington Beach, CA (US)

(72) Inventor: Christopher Pagnanelli, Huntington Beach, CA (US)

(73) Assignee: Pagnanelli Family Trust, Huntington Beach, CA (US)

( * ) Notice: Subject to any disclaimer, the term of this patent is extended or adjusted under 35 U.S.C. 154(b) by 328 days.

(21) Appl. No.: 17/891,054

(22) Filed: Aug. 18, 2022

(65) Prior Publication Data

US 2023/0054768 A1 Feb. 23, 2023

Related U.S. Application Data

(60) Provisional application No. 63/235,040, filed on Aug. 19, 2021.

(51) Int. Cl.
| | |
|---|---|
| *G11C 5/06* | (2006.01) |
| *H03K 17/0416* | (2006.01) |
| *H03K 17/08* | (2006.01) |
| *H03K 17/16* | (2006.01) |
| *H03K 19/00* | (2006.01) |
| *H03K 19/0175* | (2006.01) |
| *H03K 19/0185* | (2006.01) |

(52) U.S. Cl.
CPC ....... *G11C 5/063* (2013.01); *H03K 17/04163* (2013.01); *H03K 17/08* (2013.01); *H03K 17/161* (2013.01); *H03K 19/0005* (2013.01); *H03K 19/0175* (2013.01); *H03K 19/018528* (2013.01)

(58) Field of Classification Search
CPC .. G11C 5/063; H03K 17/08; H03K 17/04163; H03K 17/161; H03K 19/0175; H03K 19/0005; H03K 19/018528
See application file for complete search history.

(56) References Cited

U.S. PATENT DOCUMENTS

| | | | |
|---|---|---|---|
| 6,448,815 B1* | 9/2002 | Talbot | H04L 25/028 326/86 |
| 7,911,244 B2* | 3/2011 | Kikuchi | H04L 25/0276 327/563 |
| 8,760,189 B2* | 6/2014 | Zhong | H04L 25/0278 326/30 |
| 2006/0181348 A1* | 8/2006 | Dreps | G11C 7/1078 330/254 |
| 2008/0106336 A1* | 5/2008 | Pera | H03F 3/45085 330/260 |
| 2011/0268198 A1* | 11/2011 | Nishioka | H04L 25/0272 375/257 |
| 2012/0326745 A1* | 12/2012 | Kothandaraman | H03K 19/018528 326/82 |
| 2021/0141247 A1* | 5/2021 | Tatsumi | G02F 1/0121 |

* cited by examiner

*Primary Examiner* — Daniel D Chang
(74) *Attorney, Agent, or Firm* — LOZA & LOZA, LLP; Joseph Swan

(57) ABSTRACT

Provided are, among other things, systems, apparatuses, methods and techniques for driving a differential transmission line and an associated differential load. One such apparatus includes an input data line; an output data line; positive and negative supply rails; a pair of source termination resistors coupled to the positive supply rail; a first pair of n-channel transistors coupled to the source resistors and to the output data line; and a second pair of n-channel transistors coupled to the output line and to the negative supply rail.

12 Claims, 2 Drawing Sheets

DIFFERENTIAL LINE DRIVER

FIELD OF THE INVENTION

The present invention pertains to apparatuses and methods for driving differential transmission lines and an associated (terminating) differential load. It is particularly applicable to integrated circuit applications in high-speed fabrication processes where p-channel transistors are not well matched in performance and/or size, with their n-channel counterparts.

BACKGROUND

The following discussion concerns background information related to the present invention, including discussion of relevant prior art. In certain instances, the following discussion also provides the present inventor's identification and analysis of some of the problems of the prior art as they relate to the present invention, and/or observations regarding and/or characterizations of the prior art. However, it should be understood that only knowledge clearly, explicitly and specifically described herein as being "conventional" or "prior art" is intended to be characterized as such. Everything else should be understood as knowledge and/or insight originating from the present inventor.

Transferring electronic signals from a source to a load with minimal distortion and transmission loss occurs when signal propagation takes place over a doubly-terminated transmission line, such that the driving impedance of the source and the terminating impedance of the load are precisely matched to the characteristic impedance of the transmission line. Conventionally, a signal is sourced from a differential line driver, and the signal propagates over a differential transmission line, in order to reduce transmission errors that might occur due to electromagnetic interference that couples into the transmission system as common-mode noise. Of the differential line drivers utilized in conventional transmission systems, the two most common are the current-mode line (CML) driver and the source-series terminated (SST) line driver. The CML driver utilizes two n-channel transistors to switch current between two resistive elements, which together provide a source termination to a differential transmission line, regardless of the data being transferred to the load device (i.e., load termination). In contrast, the SST line driver utilizes two n-channel transistors and two p-channel transistors to switch current between a first pair of resistive elements and a second pair of resistive elements, where the pair of resistive elements that provides a source termination to a differential transmission line depends on the data being transferred to the load device. Although the conventional SST line driver has higher complexity, it is more efficient than the conventional CML driver with respect to current utilization, because unlike the CML driver, the SST line driver delivers all available current to the load device.

Line driver 10A shown in FIG. 1A, is representative of a conventional CML driver. Representative CML driver 10A comprises two field-effect transistors FETs 1A&B, two resistive elements (source resistors 2A&B), and two inputs lines 6A&B for receiving a complementary bit of data. Conventionally, FETs 1A&B are n-channel transistors which act as voltage-controlled switches, such that the switch turns on when the voltage potential at its gate terminal is made higher than the voltage potential at its source terminal (e.g., switch 1A turns on when the gate voltage on input line 6A is slightly higher than the source voltage at node 9). The source terminals of FETs 1A&B (e.g., node 9) typically are coupled to a current source that determines the overall (available) current of the line driver. To transmit a data bit corresponding to a logical one, the voltage potential on input line 6A typically is made a few hundred millivolts higher than the voltage potential on complementary input line 6B, to ensure that FET 1A switches on and FET 1B switches off. This condition causes ¼ of the total available current of 20 mA, or an amount equal to 5 mA, to flow in a forward direction from source resistor 2A to node 9 through load resistor 5 (i.e., current flows in the forward direction from node ① to node ②). Under this condition, ¾ of the total available current of 20 mA, or an amount equal to 15 mA, flows directly from source resistor 2B to node 9 without passing through load resistor 5. Otherwise, to transmit a data bit corresponding to a logical zero, the voltage potential on input line 6A typically is made a few hundred millivolts lower than the voltage potential on complementary input line 6B, to ensure that FET 1A switches off and FET 1B switches on. This alternate condition causes ¼ of the total available current of 20 mA, or an amount equal to 5 mA, to flow in an opposite direction from source resistor 2B to node 9 through load resistor 5 (i.e., current flows in the reverse direction from node ② to node ①). Under this alternate condition, ¾ of the total available current of 20 mA, or an amount equal to 15 mA, flows from source resistor 2A directly to node 9 without passing through load resistor 5. In either case, only ¼ (25%) of the total available current is transferred to the load device (i.e., load termination). But despite this inefficiency, relatively small voltage swings in the drive level at the data input lines (e.g., input lines 6A&B) can produce relatively large voltage swings at the load device. At drive levels that are significantly less than the supply rails, for example, line driver 10A can produce a differential voltage $\Delta v$ across load resistor 5 that is the equivalent of ±5 mA multiplied by the resistance of load resistor 5 (e.g., $\Delta v=\pm 500$ mV for $R_L=100\Omega$). Referring to FIG. 1A, differential transmission line 4 (supplied by output lines 7A&B) is doubly-terminated with a load termination of $R_L$ provided by load resistor 5, and a source termination of $R_L$ provided by the combined impedance of source resistors 2A&B in series (i.e., each of source resistors 2A&B has an impedance equal to $\frac{1}{2}R_L$). Because FETs 1A&B can switch fully on and fully off with relatively small voltage swings on the input data lines (e.g., input data lines 6A&B), the CML driver can provide a high degree of impedance matching between source and load terminations, resulting in low transmission loss.

Line driver 10B shown in FIG. 1B is representative of a conventional SST line driver. Representative SST line driver 10B comprises two p-channel transistors (p-channel FETs 11A and 12A), two n-channel transistors (n-channel FETs 11B and 12B), four resistive elements (source resistors 13A-D), and two inputs lines 16A&B for receiving a complementary bit of data. Conventionally, FETs 11A and 12A are p-channel transistors which act as voltage-controlled switches, such that each such switch is on except when the voltage potential at its gate terminal increases to within a few hundred millivolts of the voltage potential at its source terminal (e.g., switch 12A switches off when the gate voltage on input line 16A is nearly equal to the source voltage at supply node 18). In this conventional arrangement, FETs 11B and 12B are n-channel transistors which act as voltage-controlled switches, such that each such switch is on except when the voltage potential at its gate terminal decreases to within a few hundred millivolts of the voltage potential at its source terminal (e.g., switch 11B switches off when the gate voltage on input line 16A is nearly equal to the source voltage at ground node 19). To transmit a data bit corresponding to a logical one, the voltage potential on input line 16A is made to be very near the positive supply rail at node 18, and the voltage potential on the complementary input line 16B is made to be very near the negative (lower) supply rail at node 19 (e.g., a negative supply rail at ground potential), so that FETs 11A&B switch on and FETs 12A&B switch off. This condition causes current to flow in a forward direction from positive supply node 18 to negative supply node 19 through load resistor 15 (i.e., current flows in the forward direction from node ① to node ② via source resistors 13A&B). This is the only available path for current to flow, and for the case where the negative supply node (e.g., node 19) is at a ground potential, the total current through load resistor 5 is approximately equal to $+\frac{1}{2} \cdot V_{DD}/R_L$. Otherwise, to transmit a data bit corresponding to a logical zero, the voltage potential on input line 16A is made to be very near the negative supply rail at node 19, and the voltage potential on complementary input line 16B is made to be very near the positive supply rail at node 18, so that FETs 11A&B switch off and FETs 12A&B switch on. This alternate condition causes current to flow in an opposite direction from positive supply node 18 to negative supply node 19 through load resistor 15 (i.e., current flows in the reverse direction from node ② to node ① via source resistors 13C&D). Again, this is the only available path for current to flow, and for the case where the negative supply node (e.g., node 19) is at a ground potential, the total current through load resistor 5 is approximately equal to $-\frac{1}{2} \cdot V_{DD}/R_L$. If the potential at positive supply node 18 is 1 V (i.e., $V_{DD}=1$) and the load resistance is equal to 100 ohms (i.e., $R_L=100\Omega$), then the differential voltage $\Delta v$ across load resistor 15 is the equivalent of ±5 mA multiplied by a load resistance of 100Ω, and consequently $\Delta v=\pm 500$ mV. In either case, all the total available current of 5 mA is transferred to the load device (i.e., the SST line driver has high efficiency because 100% of available current passes through load resistor 15). Differential transmission line 14 (supplied by output lines 17A&B) is doubly-terminated with a source and load termination of $R_L$. Depending on the data bit being transferred, the source termination is provided by the combined impedance of source resistors 13A&B in series, or alternatively, by the combined impedance of source resistors 13C&D in series (i.e., each of source resistors 13A-D has an impedance equal to $\frac{1}{2}R_L$). The load termination is always provided by load resistor 15. For the SST line driver, the impedance matching between the source and load terminations is best, and consequently the transmission loss is lowest, when one of FET pair 11A&B and FET pair 12A&B switches fully on and the other of such FET pairs switches fully off. The above condition occurs only when the voltages on the input data lines swing from the positive supply rail at node 18 to the negative supply rail at node 19 (i.e., the voltage swing on input data lines 16A&B is rail-to-rail). Unlike representative CML driver 10A, therefore, relatively large voltage swings in the drive level at the input lines (e.g., input lines 16A&B) of representative SST line driver 10B, are needed to produce relatively large voltage swings at the load device.

Relatively poor efficiency with respect to current utilization makes the CML driver of circuit 10A a less-than-desirable option for fabrication in high-speed semiconductor processes (e.g., GaAs, GaN, InP, etc.), where p-channel transistors are not well matched in performance and/or size with their n-channel counterparts. Despite poor efficiency, however, the CML driver utilizes only n-channel transistors and even with relatively small drive levels on the input data lines, it can produce relatively large voltage swings at the load device and provide a degree of impedance matching high enough for low transmission loss at high data rates. Although better with regard to overall efficiency, the present inventor has recognized that the need for p-channel transistors makes the conventional SST line driver an undesirable option for fabrication in these high-speed semiconductor processes. The present inventor also has recognized that simply replacing the p-channel transistors in the conventional SST line driver (e.g., p-channel FETs 11A and 12A of driver 10B) with n-channel transistors, can have undesirable performance implications in high-speed applications where it is difficult to realize high drive levels on the input data lines. To completely switch on the replacement n-channel devices, the drive level on the input data lines would have to be high enough to overcome the voltage drop across the source termination resistors (e.g., source resistors 13A-D) and the pass transistors which are coupled to the negative supply rail (e.g., pass transistors 11B and 12B). More specifically, the drive level on the input data lines might have to be a volt or more to support a load current of 5 mA, when the source resistance is 100 ohms and the negative (lower) supply rail is at ground potential (e.g., each of source resistors 13A-D has an impedance equal to 50 ohms and node 19 is at ground potential). Incomplete on/off switching of the replacement n-channel devices can reduce the current delivered to the load device and increase the transmission losses associated with imperfect impedance matching of source and load terminations.

SUMMARY OF THE INVENTION

As a superior alternative to either the conventional CML driver or the conventional SST line driver for use in high-speed fabrication processes, where n-channel transistors are significantly better than p-channel transistors, the present inventor has developed a line driver circuit that, like the conventional CML driver (e.g., driver 10A), utilizes only n-channel transistors to maximize load current and minimize transmission loss with less than rail-to-rail voltage swings on the input data lines; and like the conventional SST line driver (e.g., driver 10B) features high efficiency in that it maximizes current transfer to the load device.

More specifically, an improved differential line driver is disclosed which utilizes only n-channel transistors, provides a high degree of impedance matching between source and load terminations, and maximizes current transfer to a load device. Compared to conventional CML drivers and conventional SST line drivers, this combination of features makes this improved line driver a superior alternative for applications requiring high-speed data transfer and fabrication in high-speed semiconductor processes.

Thus, one embodiment of the invention is directed to an apparatus, for driving a differential transmission line and an associated differential load, that includes: a differential input line; a differential output line; positive and negative supply rails; a pair of source termination resistors coupled to the positive supply rail; a first pair of transistors, each having a first terminal (e.g., gate or base) coupled to the differential input line, a second terminal (e.g., source or emitter) coupled to the negative supply rail, and a third terminal (e.g., drain or collector) coupled to the output line; a second pair of transistors, each having a first terminal (e.g., gate or base) coupled to the differential input data line, a second terminal (e.g., source or emitter) coupled to the output line, and a third terminal (e.g., drain or collector) coupled to the source termination resistors. Each of the transistors is an n-channel device, and preferably, each of the transistors is a field-effect transistor. Each of the source termination resistors has an impedance that is equal to, or at least approximately equal to, the characteristic impedance of the differential transmission line and the input impedance of the associated load device, which are driven by the apparatus via the output line.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED EMBODIMENT(S)

Figure 2:
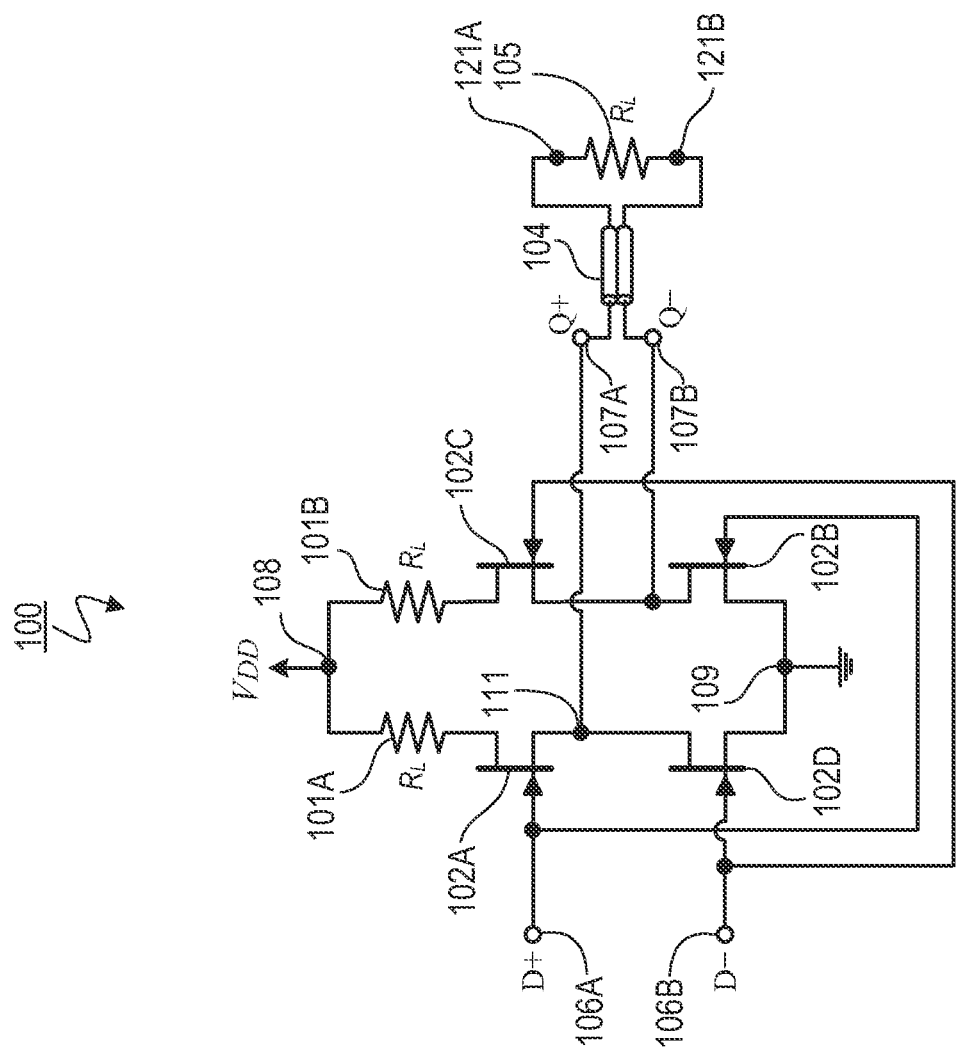
FIG. 2 is a simplified schematic of an exemplary, improved differential line driver, which delivers a current of ±5 mA to a load device utilizing only n-channel transistors and a +1 volt supply.

A differential line driver 100 that typically is more efficient, in terms of current delivered to a load device, and also can be implemented using only n-channel transistors, is shown in the simplified schematic of FIG. 2. Broadly speaking, a differential line driver according to the present invention (e.g., differential line driver 100) has a similar purpose as the conventional circuits 10A and 10B, discussed in the Background section above, in that it inputs a signal on a differential input data line (e.g., differential input data line 106A&B) and outputs a signal on a differential output data line (e.g., differential output data line 107A&B), which in turn drives a differential transmission line (e.g., differential transmission line 104) and associated load (e.g., load 105). Referring to the exemplary embodiment illustrated in FIG. 2, line driver 100 improves on the conventional SST line driver (e.g., driver 10B) by utilizing four n-channel transistors (e.g., transistors 102A-D of driver 100), instead of a pair of p-channel transistors (e.g., transistors 11A and 12A of driver 10B) and a pair of n-channel transistors (e.g., transistors 11B and 12B of driver 10B). Exemplary driver 100 further improves on the conventional SST line driver in that: 1) it utilizes only two resistors for source termination (e.g., resistors 101A&B of driver 100), instead of four resistors (e.g., resistors 13A-D of driver 10B); and 2) the two source resistors couple the positive supply rail (e.g., positive supply at node 108) to the switching transistors, thereby reducing the drive levels necessary at the data inputs to maximize current delivered to the load device (i.e., load termination) and minimize transmission loss. Exemplary driver 100 improves on the conventional CML driver (e.g., driver 10A) by using an extra pair of switching transistors (e.g., transistors 102A&C of driver 100) to ensure that all available current is delivered to a load device (e.g., all of the driver's available current passes through load resistor 105).

Referring to FIG. 2 (which shows an exemplary embodiment of driver 100), the available current is equal to $½·V_{DD}/R_L$ for the preferred embodiment where the negative supply rail is at ground potential, and where the voltage drop across the junctions of the pass transistors is negligible (e.g., the voltage drop across pass transistors 102A-D is nearly zero volts). Although a ground potential is preferred, in alternate embodiments the negative supply rail is at other than ground potential. A data bit corresponding to a logical one is input into differential input data line 106A&B, and all the available current is delivered to the load device in a forward direction (e.g., all available current passes through load resistor 105 in the forward direction from node 121A to node 121B), when: 1) the voltage potential on input line 106A is a few hundred millivolts greater than $½·V_{DD}$; and 2) the voltage potential on complementary input line 106B is decreased to within a few hundred millivolts of the negative supply rail at node 109. Under these conditions and for appropriately sized pass transistors (102A-D), FETs 102A&B switch on, FETs 102C&D switch off, and resistor 101A provides a source termination. Alternatively, a data bit corresponding to a logical zero is input into differential input data line 106A&B, and all the available current is delivered to the load device 105 in a reverse direction (e.g., all available current passes through load resistor 105 in the reverse direction from node 121B to node 121A), when: 1) the voltage potential on complementary input line 106B is a few hundred millivolts greater than $½·V_{DD}$; and 2) the voltage potential on input line 106A is decreased to within a few hundred millivolts of the negative supply rail at node 109. Under these conditions and for appropriately sized transistors (102A-D), FETs 102A&B switch off, FETs 102C&D switch on, and resistor 101B provides a source termination. Preferably, the transistors (e.g., transistors 102A-D) are field-effect transistors (FETs), but other types of transistors may be utilized in alternate embodiments, including bipolar-junction transistors (BJTs). Additionally, the transistors preferably are sized so that for the intended amount of current passing though load resistor 105 (e.g., approximately $½·V_{DD}/R_L$ for exemplary driver 100 with a negative supply rail at ground potential), the voltage drop across the junctions of the pass transistors is less than one-fourth the voltage potential across the supply rails (e.g., the voltage potential across the drain-source junction of FETs 102A&B is less than $¼·V_{DD}$). In other embodiments, however, transistor sizing can allow for a greater voltage drop at the expense of less current being available to the load device. In the preferred embodiments, each of the source termination resistors (e.g., resistors 101A&B) has an impedance that is nearly equal to the characteristic impedance $R_L$ of the differential transmission line 104 and associated load (e.g., the impedance of the source termination resistors is within ±20% of $R_L$ to ensure a transmission loss of <1%). In alternate embodiments, however, each of the source termination resistors has an impedance which is only approximately equal to the characteristic impedance of the differential transmission line and associated load (e.g., within ±75% of $R_L$ to ensure a transmission loss of <10%), or multiple resistors provide a source termination (e.g., at least one source termination is provided by multiple resistors in series or in parallel). The differential voltage Δv across load resistor 105 is the equivalent of ±5 mA multiplied by a load resistance of 100Ω, and consequently Δv=±500 mV, if: 1) the potential at positive supply node 108 is 1 V (i.e., $V_{DD}$=1); 2) the load resistance is equal to 100 ohms (i.e., $R_L$=100Ω); and 3) the voltage drop across the pass transistors is negligible (i.e., the voltage drop is approximately equal to zero volts).

Although in the preferred embodiments, the transistors of the improved driver (e.g., exemplary driver 100 of FIG. 2) are sized so that the voltage drop across the transistors is negligible (i.e., nearly equal to zero volts), or at least less than ¼·$V_{DD}$, and the intended current to load resistor 105 is approximately equal to ½·$V_{DD}$/$R_L$, it is sometimes advantageous to size the transistors differently. Although larger transistors introduce a smaller voltage drop (e.g., the drain-source voltage for FETs and the collector-emitter voltage for BJTs), smaller transistors can introduce less parasitic capacitance for operation at higher data rates (i.e., higher data-switching speeds), and can occupy less physical area on an integrated circuit. An appreciable voltage drop of ΔV across a pair of pass transistors reduces the available current to the load device (i.e., load termination) by an amount equal to ΔV/$R_L$, and also increases the required drive level on the high-side FETs by ΔV (e.g., the required drive level on FETs 102A&C increases by ΔV). Besides being inversely related to transistor size, the voltage drop across a transistor is inversely related to the drive level on the input data lines (e.g., drive level on data inputs 106A&B), such that a lower voltage drop occurs with higher drive level (i.e., higher gate voltage for a FET and higher base current for a BJT). Therefore, higher drive levels will increase the available current to load resistor 105. By applying conventional simulation and analysis methods to the improved line driver circuit, a designer can generally select a transistor size that is optimized for a particular drive level on the data inputs, a desired amount of current to the load device, and an intended data rate for operation.

Figure 1B:
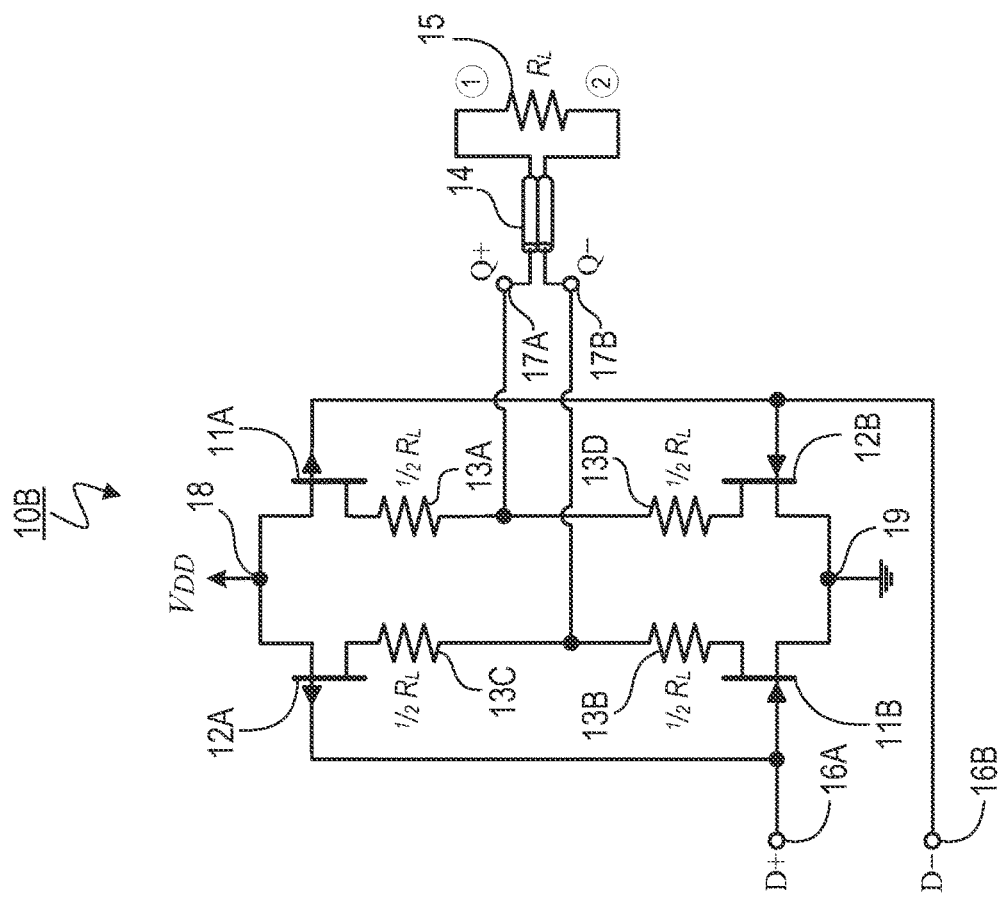
FIG. 1B is a representative schematic for a conventional source-series terminated (SST) line driver, which delivers a current of ±5 mA to a load device utilizing a pair of p-channel transistors, a pair of n-channel transistors, and a +1 volt supply.
Figure 1A:
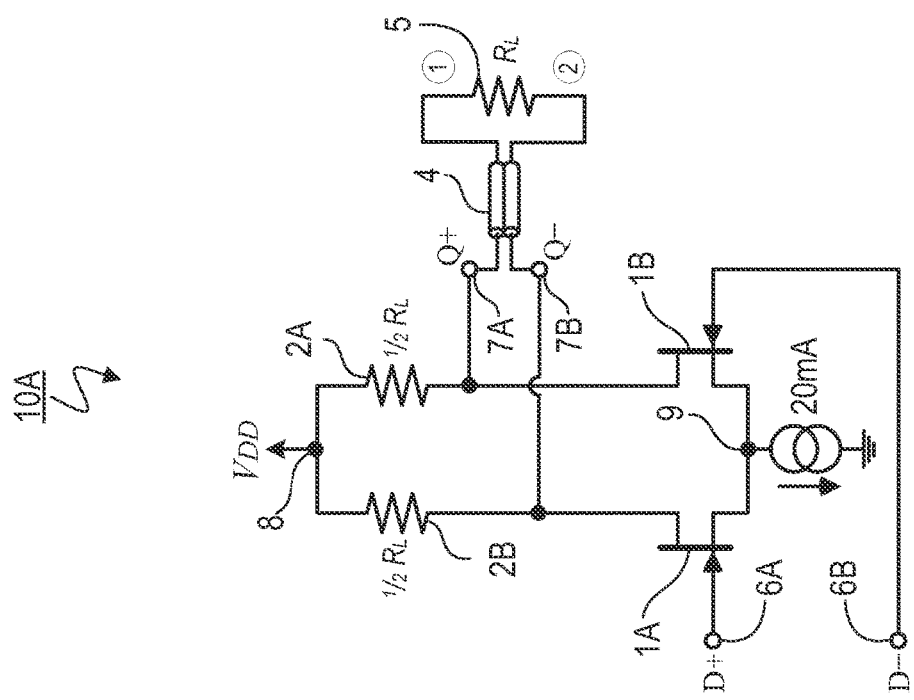
FIG. 1A is a representative schematic for a conventional current-mode line (CML) driver, which delivers a current of ±5 mA to a load device utilizing a pair of re-channel transistors and 20 mA of current from a +1 volt supply.

In either case of a transmitted data bit corresponding to a logical one or a logical zero, and regardless of the voltage drop ΔV across the pass transistors, all the total available current of exemplary driver 100 is transferred to the load device (i.e., load termination), compared to a conventional CML driver (e.g., driver 10A of FIG. 1A) where only ¼ of the available current is transferred to the load device. For exemplary driver 100, all (100%) of the available current passes through load resistor 105, and this represents a 4 times improvement over the conventional CML driver. Also, regardless of the data bit being transferred to the load device, differential transmission line 104 is doubly-terminated with a source and load termination of $R_L$. With drive levels on the data input lines that are as small as one-half the potential across the supply rails, relatively large voltage swings can be produced at the load device and relatively low transmission losses can be realized via high degrees of impedance matching. This represents a factor of two improvement over the conventional SST line driver (e.g., driver 10B of circuit 1B), where delivering maximum current to a load device and providing the highest degree of impedance matching between source and load terminations requires drive levels that are near the limits of the supply rails.

Additional Considerations

The exemplary circuit 100 discussed above uses FET transistors (102A-D) as electronic switches. As already noted, although FET transistors are currently preferred, in alternate embodiments of the invention, any or all of such FET transistors can be replaced with other types of transistors, such as bipolar junction transistors, or for that matter, any other type of electronic switch (whether now known or subsequently devised). However, n-channel devices are preferred (e.g., for the reasons discussed above). Generally speaking, when the present discussion refers to, and/or wherein the drawing(s) depict a FET transistor, such references can be replaced with references to any such other kinds of transistors, transistor circuits or other electronic switches. Any such electronic switch typically will have a control terminal (e.g., the gate in a FET transistor) and current-flow path terminals for the path through which current primarily flows when the device is turned on (e.g., the source and drain terminals for a FET transistor). Any references herein (written description or drawings) to specific (e.g., FET) terminals can be replaced with the foregoing more-generalized corresponding terminal descriptors. Unless specified otherwise herein, when there is a reference herein to a given terminal of a FET transistor or other electronic switch being coupled to another terminal or component, such a reference pertains to a coupling path other than through the transistor or electronic switch itself.

As used herein, the words "include", "includes", "including", and all other forms of the word should not be understood as limiting, but rather any specific items following such words should be understood as being merely exemplary.

As used herein, the term "coupled", or any other form of the word, is intended to mean either directly connected or connected through one or more other elements, components or processing blocks, e.g., for the purpose of preprocessing. In the drawings and/or the discussions of them, where individual components are shown and/or discussed as being directly connected to each other, such connections should be understood as couplings, which may include additional elements, components, modules, and/or processing blocks. Unless otherwise specified, the expression "directly connected", as used herein, is intended to mean connected without any substantial intermediate impedance (i.e., without any impedance that would be taken into account by one of ordinary skill in the art). Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" can mean, e.g.: within ±10% of the stated value or within ±20% of the stated value.

The present invention is described above with respect to a particular embodiment having certain features. However, it is intended that the features described in connection with the discussion of this embodiment are not limited to that embodiment, but may be included and/or arranged in various combinations and in other embodiments as well, as will be understood by those skilled in the art.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiment thereof and accompanying drawings, it should be apparent to those skilled in the art that various adaptations and modifications of the present invention may be accomplished without departing from the intent and the scope of the invention. Accordingly, the invention is not limited to the precise embodiment shown in the drawings and described above. Rather, it is intended that all such variations not departing from the intent of the invention are to be considered as within the scope thereof, as limited solely by the claims appended hereto.

What is claimed is:

1. An apparatus for driving a differential transmission line and associated differential load, comprising:
    a differential input data line;
    a differential output data line;
    a positive supply rail and a negative supply rail;
    a pair of source termination resistors coupled to said positive supply rail;
    a first pair of transistors, each having a first terminal coupled to said differential input data line, a second terminal connected to said negative supply rail so that there is no substantial intermediate impedance, and a third terminal coupled to said output data line;
    a second pair of transistors, each having a first terminal coupled to said differential input data line, a second terminal coupled to said output data line, and a third terminal coupled to one of said source termination resistors,
    wherein each of said source termination resistors has an impedance that is approximately equal to the characteristic impedance of the differential transmission line and to the impedance of the associated differential load, and
    wherein each transistor within said first pair of transistors and said second pair of transistors is a n-channel device.

2. An apparatus according to claim 1, wherein at least one of the transistors from among said first pair of transistors and said second pair of transistors is a field-effect transistor.

3. An apparatus according to claim 1, wherein at least one of the transistors from among said first pair of transistors and said second pair of transistors is a bipolar-junction transistor.

4. An apparatus according to claim 1, wherein the negative supply rail is at ground potential.

5. An apparatus according to claim 1, wherein each of said source termination resistors has an impedance that is within +10% of the characteristic impedance of the differential transmission line and of the impedance of the associated differential load.

6. An apparatus according to claim 1, wherein the third terminal of each of the second pair of transistors is coupled to said positive supply rail through one of said source termination resistors.

7. An apparatus according to claim 1, wherein the second terminal of each transistor in the second pair of transistors is directly connected to the third terminal of one of the transistors in the first pair of transistors.

8. An apparatus according to claim 1, wherein the transistors are sized such that the transistors that are turned on cumulatively provide a voltage drop of less than ¼ the voltage potential across the positive and negative supply rails when an intended drive level is applied at said differential input data line.

9. An apparatus according to claim 1, wherein the transistors are sized such that the transistors that are turned on cumulatively provide a voltage drop of less than ¼ the voltage potential across the positive and negative supply rails when an intended current passes through said differential output data line.

10. An apparatus according to claim 1, wherein the first terminal of each transistor of the first pair of transistors and the second pair of transistors is a control terminal for said transistor.

11. An apparatus according to claim 10, wherein the differential input data line includes a first data line and a second data line, and wherein each of the first pair of transistors and the second pair of transistors includes one transistor having its control terminal coupled to the first data line and another transistor having its control terminal coupled to the second data line.

12. An apparatus according to claim 1, wherein each of said source termination resistors has an impedance that is within ±20% of the characteristic impedance of the differential transmission line and of the impedance of the associated differential load.

* * * * *

UNITED STATES PATENT AND TRADEMARK OFFICE
CERTIFICATE OF CORRECTION

Page 1 of 1

PATENT NO. : 12,367,910 B2
APPLICATION NO. : 17/891054
DATED : July 22, 2025
INVENTOR(S) : Christopher Pagnanelli It is certified that error appears in the above-identified patent and that said Letters Patent is hereby corrected as shown below:

In the Specification

Column 5 Line 26 reads: pair of re-channel

Should read: pair of n-channel

Signed and Sealed this
Seventh Day of October, 2025

John A. Squires
*Director of the United States Patent and Trademark Office*